United States Patent
Li et al.

(10) Patent No.: US 12,266,377 B2
(45) Date of Patent: Apr. 1, 2025

(54) METHOD FOR REDUCING RESIDUAL ECHO AND ELECTRONIC DEVICE USING THE SAME

(71) Applicant: ALi Corporation, Hsinchu (TW)

(72) Inventors: FenHuan Li, Zhuhai (CN); YueYong Chen, Zhuhai (CN)

(73) Assignee: ALi Corporation, Hsinchu (TW)

( * ) Notice: Subject to any disclaimer, the term of this patent is extended or adjusted under 35 U.S.C. 154(b) by 322 days.

(21) Appl. No.: 17/891,144

(22) Filed: Aug. 19, 2022

(65) Prior Publication Data

US 2023/0094054 A1 Mar. 30, 2023

(30) Foreign Application Priority Data

Sep. 27, 2021 (CN) .......................... 202111137271.8

(51) Int. Cl.

| | |
|---|---|
| *G10L 21/0232* | (2013.01) |
| *G10L 21/0208* | (2013.01) |
| *G10L 25/18* | (2013.01) |
| *H03F 3/21* | (2006.01) |
| *H04R 3/00* | (2006.01) |

(52) U.S. Cl.
CPC .......... *G10L 21/0232* (2013.01); *G10L 25/18* (2013.01); *H04R 3/00* (2013.01); *G10L 2021/02082* (2013.01); *H03F 3/21* (2013.01); *H03F 2200/03* (2013.01)

(58) Field of Classification Search
CPC . G10L 21/0232; G10L 21/0208; G10L 25/18; G10L 21/0316; G10L 19/26; G10L 2021/02082; G10L 2021/02166; G10L 2021/02165; H04R 3/00; H04R 3/02; H03F 3/21; H03F 2200/03
See application file for complete search history.

(56) References Cited

U.S. PATENT DOCUMENTS

2019/0115040 A1* 4/2019 Kamdar .............. G10L 21/0232

FOREIGN PATENT DOCUMENTS

| CN | 101763858 | A | * | 6/2010 | |
|---|---|---|---|---|---|
| CN | 105338450 | A | * | 2/2016 | ............... H04R 3/02 |
| CN | 106898359 | A | * | 6/2017 | ............ H04M 9/082 |
| CN | 111246037 | A | * | 6/2020 | ............. G10L 19/26 |

* cited by examiner

*Primary Examiner* — Yogeshkumar Patel

(57) ABSTRACT

Disclosed is a method for reducing residual echo including: performing an echo cancellation process on a voice input signal according to an echo reference signal to obtain an echo cancellation signal; performing a FFT on the echo reference signal to obtain a reference spectrum signal for each frame; performing the FFT on the echo cancellation signal to obtain a speech spectrum signal for each frame; using the reference spectrum signal and the speech spectrum signal of a current frame to obtain a priori signal-to-noise ratio of the current frame according to a principle of additive noise; filtering the speech spectrum signal of the current frame by a Wiener filter coefficient of the current frame determined by the priori signal-to-noise ratio of the current frame to obtain a target spectrum signal of each frame; performing an IFFT on the target spectrum signal of each frame to obtain a target voice signal.

13 Claims, 4 Drawing Sheets

METHOD FOR REDUCING RESIDUAL ECHO AND ELECTRONIC DEVICE USING THE SAME

CROSS REFERENCE TO RELATED APPLICATION

This application claims the priority benefit of Chinese Patent Application Serial Number 202111137271.8, filed on Sep. 27, 2021, the full disclosure of which is incorporated herein by reference.

BACKGROUND

Technical Field

The present disclosure relates to the technical field of voice echo cancellation, and in particular to a method for reducing residual echo and an electronic device using the same.

Related Art

With the rapid development of wireless communication technology and intelligent voice recognition technology, the requirements for voice quality are getting higher and higher. However, the presence of the echo may affect the voice quality, resulting in making the user experience poor or affecting the voice recognition rate.

For echo cancellation, an acoustic echo cancellation (AEC) method is generally used. An adaptive filter is configured to estimate the characteristics of the echo path to generate the same signal as the echo (hereinafter referred to as the echo signal), and then the echo signal is subtracted from the signal received by an audio reception module to achieve the effect of echo cancellation. However, in practical applications, due to various factors, such as background noise, non-linear distortion of the audio reception module and a speaker, speaker delay, and sudden changes in the echo path, the echo cannot be completely canceled by the adaptive filter, and there is a small amount of residual echo, which affects the user's hearing experience or speech recognition rate.

Therefore, how to provide a method for reducing residual echo that can accurately filter out the residual echo is an urgent problem to be solved by those skilled in the art.

SUMMARY

The present disclosure provides a method for reducing residual echo and an electronic device using the same, which can effectively solve the problems that the residual echo affects the user's hearing experience or speech recognition rate in the prior art.

In order to solve the above technical problem, the present disclosure is implemented as follows.

According to a first aspect, the present disclosure provides a method for reducing residual echo, which comprises the following steps of: performing an echo cancellation process on a voice input signal according to an echo reference signal to obtain an echo cancellation signal; performing a fast Fourier Transform (FFT) on the echo reference signal to obtain a reference spectrum signal for each frame; performing the FFT on the echo cancellation signal to obtain a speech spectrum signal for each frame; using the reference spectrum signal of a current frame and the speech spectrum signal of the current frame to obtain a priori signal-to-noise ratio of the current frame according to a principle of additive noise; filtering the speech spectrum signal of the current frame by a Wiener filter coefficient of the current frame determined by the priori signal-to-noise ratio of the current frame to obtain a target spectrum signal of each frame; and performing an inverse fast Fourier Transform (IFFT) on the target spectrum signal of each frame to obtain a target voice signal.

According to a second aspect, the present application provides an electronic device, which comprises: a non-transitory computer-readable storage medium and one or more processors. The non-transitory computer-readable storage medium is configured to store program code. The one or more processors are configured to execute the program code to: perform an echo cancellation process on a voice input signal according to an echo reference signal to obtain an echo cancellation signal; perform a FFT on the echo reference signal to obtain a reference spectrum signal for each frame; perform the FFT on the echo cancellation signal to obtain a speech spectrum signal for each frame; use the reference spectrum signal of a current frame and the speech spectrum signal of the current frame to obtain a priori signal-to-noise ratio of the current frame according to a principle of additive noise; filter the speech spectrum signal of the current frame by a Wiener filter coefficient of the current frame determined by the priori signal-to-noise ratio of the current frame to obtain a target spectrum signal of each frame; and perform an IFFT on the target spectrum signal of each frame to obtain a target voice signal.

In the embodiments of the present disclosure, the method for reducing residual echo can directly use the echo reference signal to estimate the residual echo, and obtain the Wiener filter coefficients through the priori signal-to-noise ratios. Therefore, the Wiener filter coefficients can be obtained by a low-complexity method, the residual echo is accurately filtered out, the voice pollution caused by the residual echo is reduced, and the good voice quality is ensured, and the method for reducing residual echo is convenient to be applied to electronic devices such as embedded products. In addition, when the method for reducing residual echo is applied in the field of intelligent speech recognition, it can promote the improvement of speech recognition rate. Moreover, when the method for reducing residual echo is applied to communications such as network conference calls, the call quality can be improved.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
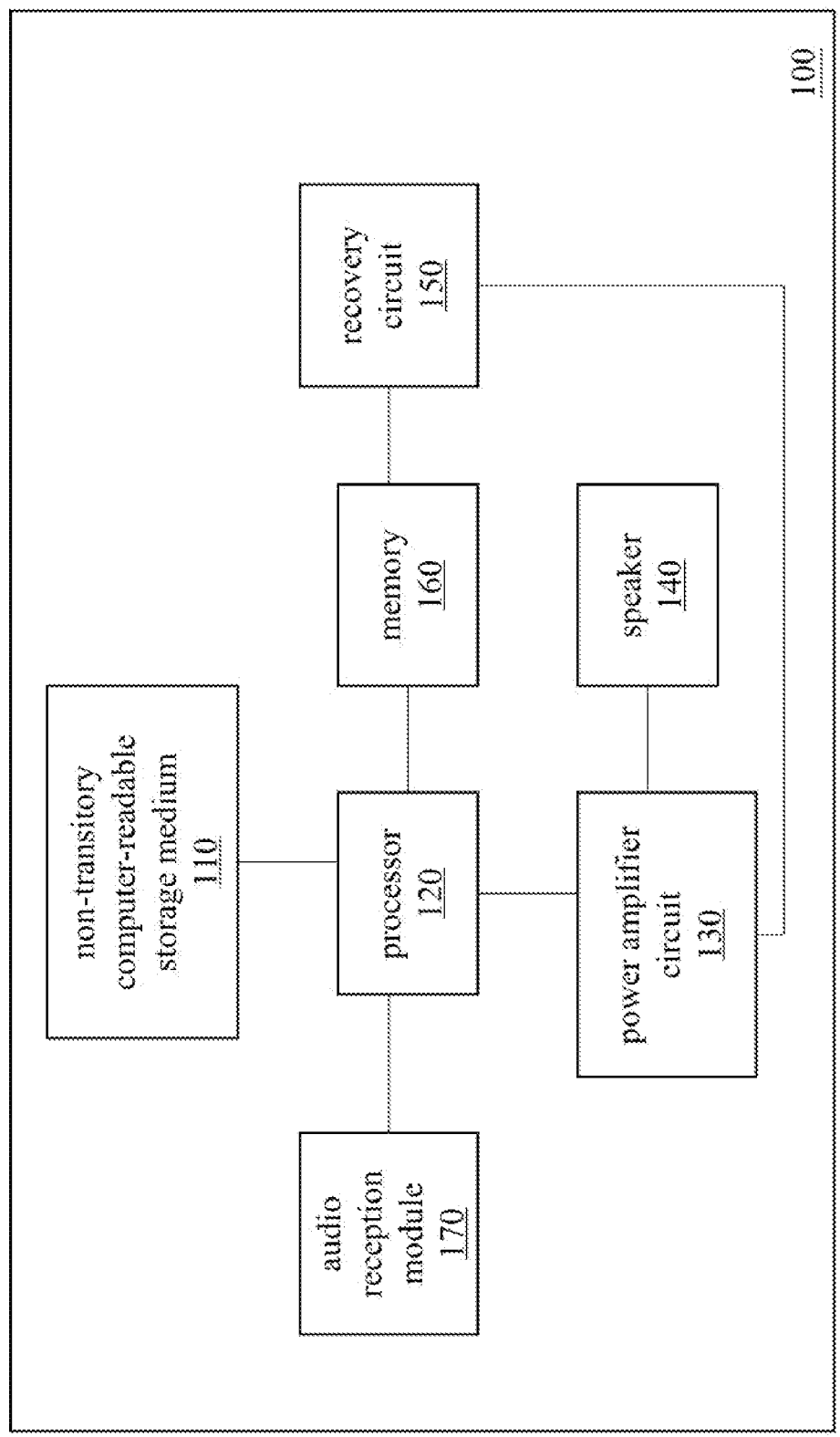
FIG. 1 is a block diagram of an electronic device according to an embodiment of the present disclosure.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

It must be understood that when a component is described as being "connected" or "coupled" to (or with) another component, it may be directly connected or coupled to other components or through an intermediate component. In contrast, when a component is described as being "directly connected" or "directly coupled" to (or with) another component, there are no intermediate components. In addition, unless specifically stated in the specification, any term in the singular case also comprises the meaning of the plural case.

In the following embodiment, the same reference numerals are used to refer to the same or similar elements throughout the disclosure.

Please refer to FIG. 1, which is a block diagram of an electronic device according to an embodiment of the present disclosure. As shown in FIG. 1, the electronic device 100 comprises a non-transitory computer-readable storage medium 110 and a processor 120, wherein the non-transitory computer-readable storage medium 110 is configured to store program code, and the processor 120 is connected to the non-transitory computer-readable storage medium 110 and is configured to execute the program code.

In this embodiment, there may be but not limited to one processor 120. For example, in an embodiment, there are multiple processors 120. The processor 120 may be a general-purpose processor, a digital signal processor (DSP), an application specific integrated circuit (ASIC), a field programmable gate array (FPGA) or other programmable logic device, discrete gates or transistor logic devices, or discrete hardware components. The non-transitory computer-readable storage medium 110 may be a read-only memory (ROM), a magnetic disk, or an optical disk.

In this embodiment, the processor 120 executes the program code stored in the non-transitory computer-readable storage medium 110 to: perform an echo cancellation process on a voice input signal according to an echo reference signal to obtain an echo cancellation signal; perform a fast Fourier Transform (FFT) on the echo reference signal to obtain a reference spectrum signal for each frame; perform the FFT on the echo cancellation signal to obtain a speech spectrum signal for each frame; use the reference spectrum signal of a current frame and the speech spectrum signal of the current frame to obtain a priori signal-to-noise ratio of the current frame according to a principle of additive noise; filter the speech spectrum signal of the current frame by a Wiener filter coefficient of the current frame determined by the priori signal-to-noise ratio of the current frame to obtain a target spectrum signal of each frame; and perform an inverse fast Fourier Transform (IFFT) on the target spectrum signal of each frame to obtain a target voice signal.

In more detail, after the processor 120 removes the echo in the voice input signal through the echo reference signal to obtain the echo cancellation signal, it performs the FFT on the echo reference signal and the echo cancellation signal in units of frames, and the echo reference signal and the echo cancellation signal are converted from the time domain to the frequency domain, and the reference spectrum signal N[k] of each frame and the speech spectrum signal Y[k] of each frame are obtained, and then the amplitude value $N_{mag}[k]$ of the reference spectrum signal of each frame in the frequency domain and the amplitude value $Y_{mag}[k]$ of the speech spectrum signal of each frame in the frequency domain are obtained, wherein $0 \leq k \leq M-1$, M is a positive integer and greater than 1, k is a frequency index, $Y_{mag}[k]$=magnitude (Y[k]), and $N_{mag}[k]$=magnitude(N[k]).

In an embodiment, the processor 120 simplifies the priori signal-to-noise ratio of each frame $\zeta_i(k)$ to the ratio of the amplitude value $S_{mag}[k]$ of the target signal to the amplitude value $N_{mag}[k]$ of the reference spectrum signal corresponding thereto in each frame according to the minimum mean square error (i.e., $$\zeta_i(k) = \frac{S_{mag}[k]}{N_{mag}[k]},$$

wherein $S_{mag}[k]$ is the amplitude value of the target signal (that is, the signal with the residual echo removed) in the frequency domain, and i is a frame index). That is to say, the priori signal-to-noise ratio of the current frame is the ratio of the non-reference spectrum signal in the speech spectrum signal of the current frame to the reference spectrum signal of the current frame. More specifically, the echo reference signal such as a music sound is regarded as the noise by the processor 120, so that the echo cancellation signal obtained by the processor 120 performing the echo cancellation processing on the voice input signal according to the echo reference signal may comprise human voices such as voice commands and other noise such as wind noise and an environmental sound. Therefore, the processor 120 can simplify the priori signal-to-noise ratio of each frame to the ratio of the amplitude value of the signal with the residual echo removed to that of the reference spectrum signal corresponding thereto in each frame according to the minimum mean square error.

In an embodiment, the processor 120 simplifies a posterior signal-to-noise ratio $\gamma_i(k)$ of each frame to the ratio of the amplitude value $Y_{mag}[K]$ of the speech spectrum signal of to the amplitude value $N_{mag}[K]$ of the reference spectrum signal corresponding thereto in each frame in the frequency domain (i.e., $$\gamma_i(k) = \frac{Y_{mag}[K]}{N_{mag}[K]},$$

wherein i is a frame index) according to the minimum mean square error. That is to say, the posterior signal-to-noise ratio of the current frame is the ratio of the speech spectrum signal of the current frame to the reference spectrum signal of the current frame.

In an embodiment, the processor 120 adds the amplitude values of the target signal (that is, the signal with the residual echo removed) and the reference spectrum signal corresponding to the speech spectrum signal of each frame according to the principle of additive noise, to obtain the amplitude value of the speech spectrum signal of each frame (i.e., $Y_{mag}[k]=S_{mag}[k]+N_{mag}[k]$). Then, the processor 120 obtains the relationship between the a priori signal-to-noise ratio of the current frame, the priori signal-to-noise ratio of the previous frame, and the posterior signal-to-noise ratio of the current frame: $\zeta_i(k)=\zeta_{i-1}(k)+(1-\alpha)(\gamma_i(k)-1)$, according to the posterior signal-to-noise ratio of each frame and the priori signal-to-noise ratio of each frame simplified using the minimum mean square error, and the principle of additive noise, wherein $\zeta_i(k)$ is the priori signal-to-noise ratio, $\gamma_i(k)$ is the posterior signal-to-noise ratio, i is the frame index, and α is a smoothing parameter with a value ranging from 0 to 1. When the value of a is close to 0, the priori signal-to-noise ratio approximates to the priori signal-to-noise ratio of the current frame obtained according to the maximum likelihood principle; and when the value of α is close to 1, the priori signal-to-noise ratio is close to the priori signal-to-noise ratio of the previous frame, so the smoothing parameter is the balance parameter of the two parts (i.e., the priori signal-to-noise ratio of the current frame obtained according to the maximum likelihood principle and the priori signal-to-noise ratio of the previous frame). That is to say, the processor 120 may obtain the priori signal-to-noise ratio of the current frame by performing smoothing on the posterior signal-to-noise ratio of the current frame and the priori signal-to-noise ratio of the previous frame based on the principle of additive noise.

In an embodiment, the processor 120 may obtain the Wiener filter coefficient of the current frame through the priori signal-to-noise ratio of the current frame. That is, $$H(\omega) = \frac{S_{mag}[k]}{Y_{mag}[k]} = \frac{S_{mag}[k]}{S_{mag}[k]+N_{mag}[k]} = \frac{\zeta_i(k)}{1+\zeta_i(k)},$$

H(ω) is the Wiener filter coefficient of the current frame, and ω is the frequency index. The processor 120 may multiply the speech spectrum signal Y(ω) of the current frame by the Wiener filter coefficient H(ω) of the current frame for filtering to obtain the target spectrum signal of the current frame, and then obtain the target spectrum signal of each frame based on the above method.

In this embodiment, the processor 120 may perform the IFFT on the target spectrum signal of each frame, convert the target spectrum signal of each frame from the frequency domain to the time domain, and integrate the conversion results into the target voice signal (that is, the signal without the residual echo).

Therefore, the electronic device 100 can directly use the echo reference signal to estimate the residual echo, and obtain the Wiener filter coefficients through the priori signal-to-noise ratio and the posteriori signal-to-noise ratio. Therefore, the Wiener filter coefficients can be obtained by a low-complexity method, the residual echo is accurately filtered out, the voice pollution caused by the residual echo is reduced, and the good voice quality is ensured. In addition, since the method for obtaining the Wiener filter coefficients by the processor 120 is low in complexity, the electronic device 100 may be an embedded product in actual implementation.

In an embodiment, the electronic device 100 may further comprise a power amplifier circuit 130, a speaker 140, and a recovery circuit 150. The power amplifier circuit 130 is connected to the processor 120, the speaker 140 is connected to the power amplifier circuit 130, and the recovery circuit 150 is connected to the power amplifier circuit 130. The power amplifier circuit 130 is configured to output an audio analog signal, the speaker 140 is configured to play the audio analog signal, and the recovery circuit 150 is configured to collect the audio analog signal and perform analog-to-digital conversion on the audio analog signal to obtain the echo reference signal. Since the audio analog signal collected by the recovery circuit 150 connected to the power amplifier circuit 130 is closest to the audio analog signal played by the speaker 140, the echo reference signal obtained based on the audio analog signal collected by the recovery circuit 150 can be used to reduce the noise in the echo reference signal, thereby improving accuracy.

It should be noted that the power amplifier circuit 130 and the recovery circuit 150 can be implemented by using hardware only or hardware with firmware and/or software. The firmware or software can be stored in a machine-readable storage medium, such as a random access memory (RAM), a flash memory, a read-only memory (ROM), a programmable read-only memory (PROM), an erasable programmable read-only memory (EPROM), an electrically erasable programmable read-only memory (EEPROM), a register, a disk, an optical disc, a hard drive, or any other suitable storage medium, or any combination thereof, and the firmware or software can be executed by one or more general-purpose or special-purpose programmable microprocessors.

In an embodiment, the electronic device 100 may further comprise a memory 160, which is connected to the recovery circuit 150 and the processor 120. The memory 160 is configured to store the echo reference signal. In an embodiment, the memory 160 and the processor 120 may be integrated into a system on a chip (SoC). In another embodiment, the memory 160 may comprise a high-speed random access memory, and may further comprise a non-volatile memory, such as at least one magnetic disk storage device, flash memory device, and other non-volatile solid-state storage device.

In an embodiment, the electronic device 100 may further comprise an audio reception module 170, which is connected to the processor 120. The audio reception module 170 is configured to receive a voice reception signal. The processor 120 is further configured to perform a first preprocessing procedure on the voice reception signal to obtain the voice input signal. The first preprocessing procedure comprises: performing beamforming and denoising processing on the voice reception signal to obtain the voice input signal. In an embodiment, the audio reception module 170 may be, but is not limited to, a microphone.

In another embodiment, the audio reception module 170 is configured to receive the voice input signal, and the processor 120 may perform a second preprocessing procedure on the target voice signal after obtaining the target voice signal to obtain a voice output signal. The second preprocessing procedure comprises: performing beamforming and denoising processing on the target voice signal.

Figure 2:
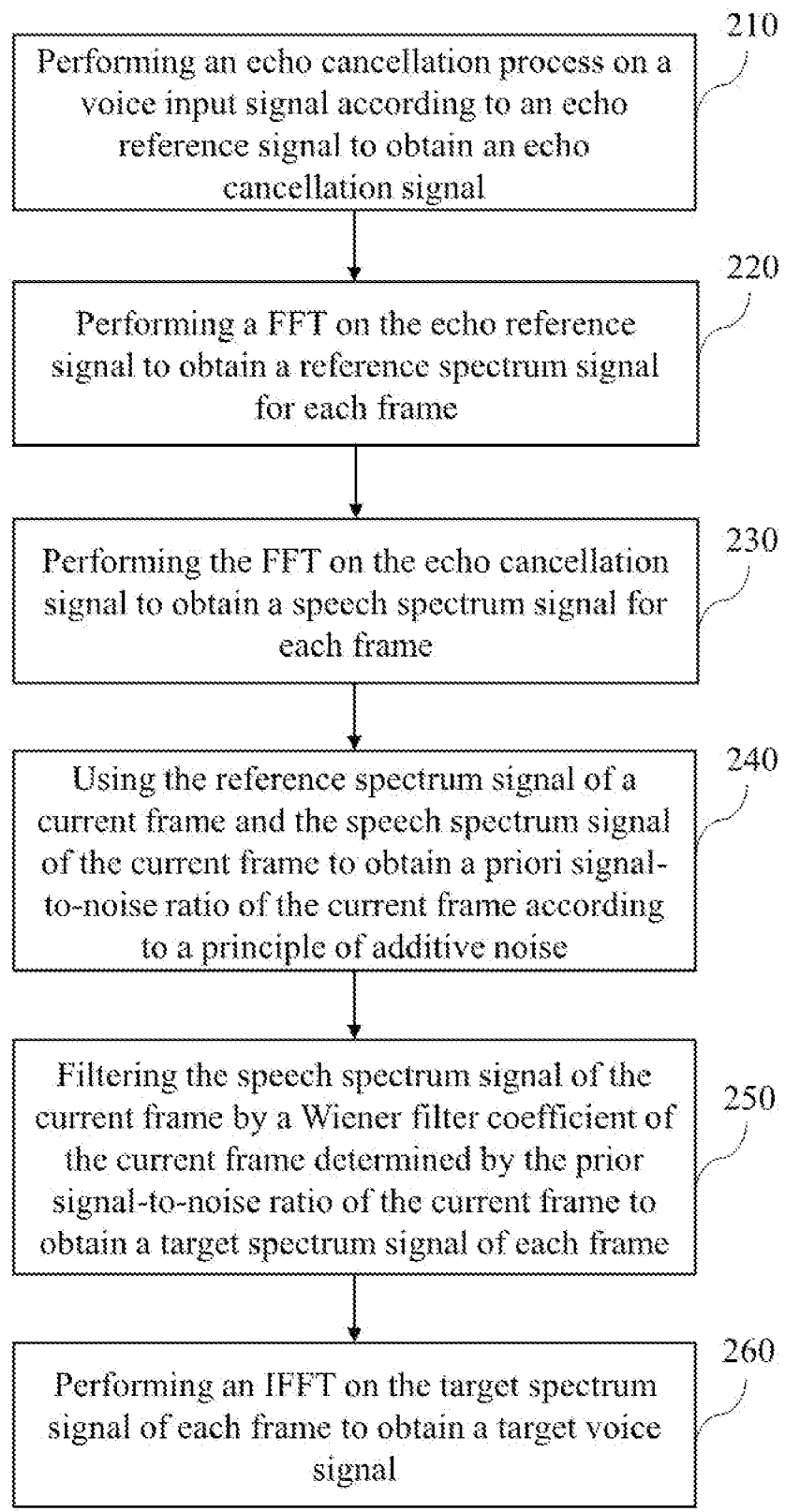
FIG. 2 is a method flowchart of a method for reducing residual echo according to an embodiment of the present disclosure.

Please refer to FIG. 1 and FIG. 2, wherein FIG. 2 is a method flowchart of a method for reducing residual echo according to an embodiment of the present disclosure. In this embodiment, the method for reducing residual echo can be applied to the electronic device 100 and comprises the following steps of: performing an echo cancellation process on a voice input signal according to an echo reference signal to obtain an echo cancellation signal (step 210); performing a FFT on the echo reference signal to obtain a reference spectrum signal for each frame (step 220); performing the FFT on the echo cancellation signal to obtain a speech spectrum signal for each frame (step 230); using the reference spectrum signal of a current frame and the speech spectrum signal of the current frame to obtain a priori signal-to-noise ratio of the current frame according to a principle of additive noise (step 240); filtering the speech spectrum signal of the current frame by a Wiener filter coefficient of the current frame determined by the priori signal-to-noise ratio of the current frame to obtain a target spectrum signal of each frame (step 250); and performing an IFFT on the target spectrum signal of each frame to obtain a target voice signal (step 260). Step 210 to step 260 can be executed by the processor 120. For detailed description, please refer to the related description of the above-mentioned electronic device 100, which will not be repeated here.

In an embodiment, step 240 may comprise: performing smoothing on a posterior signal-to-noise ratio of the current frame and the priori signal-to-noise ratio of the previous frame according to the principle of additive noise to obtain the priori signal-to-noise ratio of the current frame. For detailed description, reference may be made to the relevant description of the above-mentioned electronic device 100, which will not be repeated here.

In an embodiment, the priori signal-to-noise ratio of the current frame is the ratio of the non-reference spectrum signal in the speech spectrum signal of the current frame to the reference spectrum signal of the current frame. For detailed description, reference may be made to the relevant description of the above-mentioned electronic device 100, which will not be repeated here.

In an embodiment, the posterior signal-to-noise ratio of the current frame is the ratio of the speech spectrum signal of the current frame to the reference spectrum signal of the current frame. For detailed description, please refer to the related description of the above-mentioned electronic device 100, which will not be repeated here.

Figure 3:
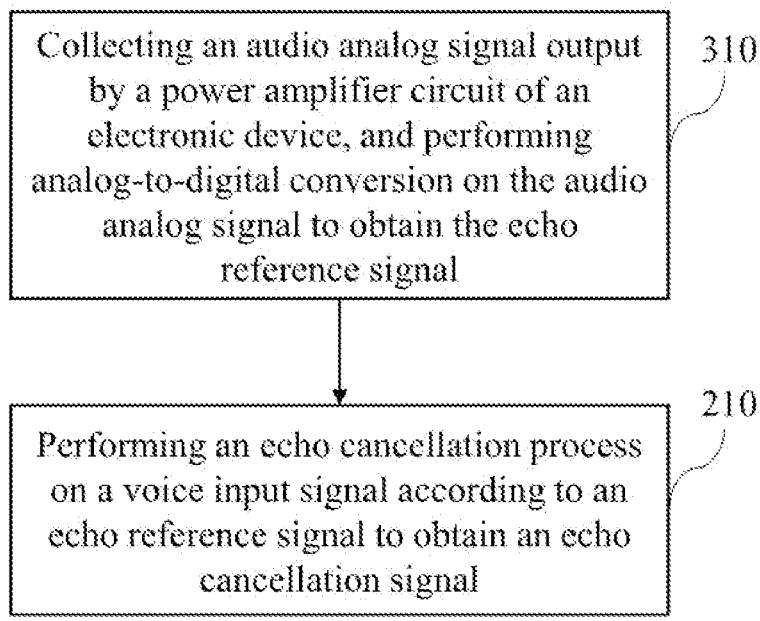
FIG. 3 is a method flowchart of a method for reducing residual echo according to another embodiment of the present disclosure.

In an embodiment, please refer to FIG. 1 and FIG. 3, wherein FIG. 3 is a method flowchart of a method for reducing residual echo according to another embodiment of the present disclosure. Before step 210, the method for reducing residual echo may further comprise: collecting an audio analog signal output by the power amplifier circuit 130 of the electronic device 100, and performing analog-to-digital conversion on the audio analog signal to obtain the echo reference signal (step 310). The audio analog signal is played through the speaker 140 of the electronic device 100. Step 310 can be performed by the recovery circuit 150. For detailed description, please refer to the related description of the electronic device 100, which will not be repeated here. It should be noted that, in order to prevent the drawing of FIG. 3 from being too dense, step 220 to step 260 are omitted in FIG. 3.

Figure 4:
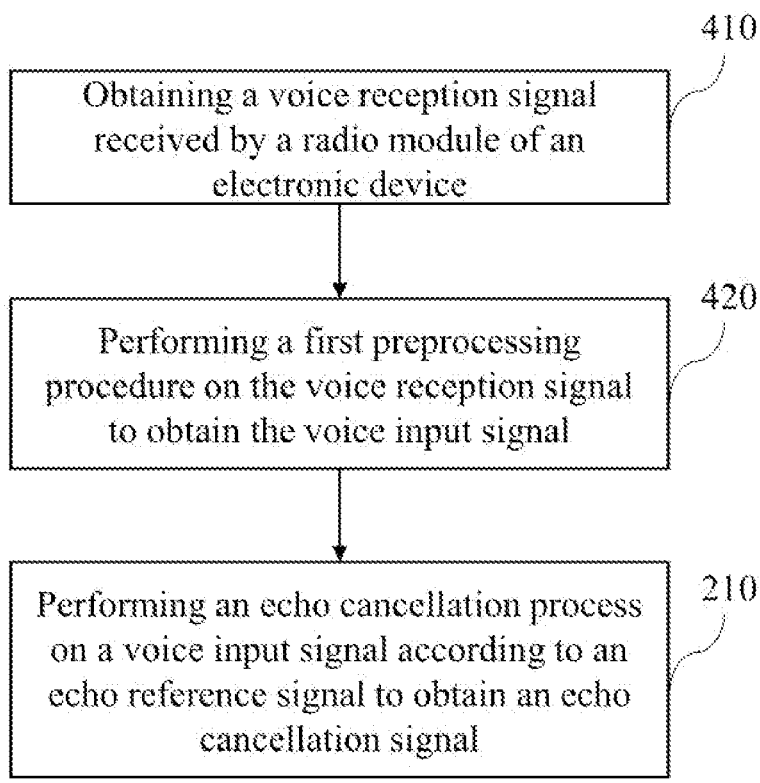
FIG. 4 is a method flowchart of a method for reducing residual echo according to still another embodiment of the present disclosure.

In an embodiment, please refer to FIG. 1 and FIG. 4, wherein FIG. 4 is a method flowchart of a method for reducing residual echo according to still another embodiment of the present disclosure. Before step 210, the method for reducing residual echo may further comprise: obtaining a voice reception signal received by the audio reception module 170 of the electronic device 100 (step 410); and performing a first preprocessing procedure on the voice reception signal to obtain the voice input signal (step 420). Step 410 and step 420 can be executed by the processor 120. For detailed description, please refer to the relevant description of the above-mentioned electronic device 100, which will not be repeated here. It should be noted that, in order to prevent the drawing of FIG. 4 from being too dense, step 220 to step 260 are omitted in FIG. 4.

In an embodiment, the first preprocessing procedure of step 420 comprises: performing beamforming and denoising processing on the voice reception signal.

Figure 5:
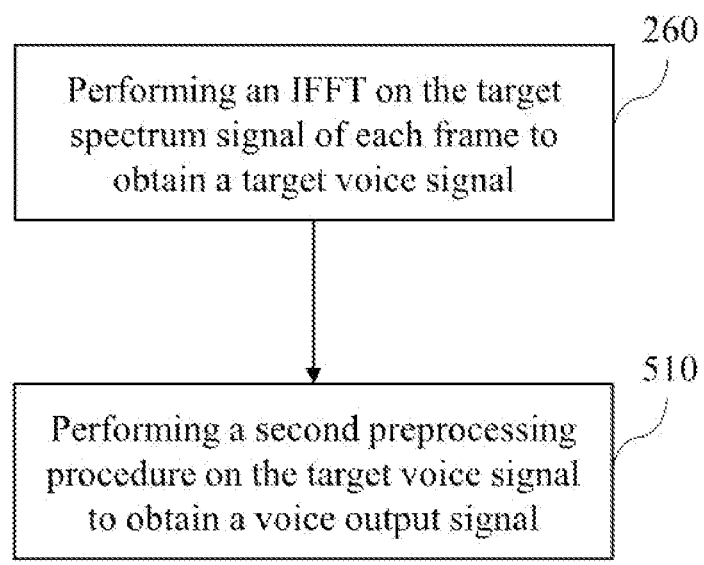
FIG. 5 is a method flowchart of a method for reducing residual echo according to yet another embodiment of the present disclosure.

In an embodiment, please refer to FIG. 1 and FIG. 5, wherein FIG. 5 is a method flowchart of a method for reducing residual echo according to yet another embodiment of the present disclosure. After step 260, the method for reducing residual echo may further comprise: performing a second preprocessing procedure on the target voice signal to obtain a voice output signal (step 510). Step 510 may be executed by the processor 120. For detailed description, reference may be made to the relevant description of the above-mentioned electronic device 100, which will not be repeated here. It should be noted that, in order to prevent the drawing of FIG. 5 from being too dense, step 210 to step 250 are omitted in FIG. 5.

In an embodiment, the second preprocessing procedure of step 510 comprises: performing beamforming and denoising processing on the target voice signal.

In summary, in the embodiments of the present disclosure, the method for reducing residual echo can directly use the echo reference signal to estimate the residual echo, and obtain the Wiener filter coefficients through the priori signal-to-noise ratio and the posteriori signal-to-noise ratio. Therefore, the Wiener filter coefficients can be obtained by a low-complexity method, the residual echo is accurately filtered out, the voice pollution caused by the residual echo is reduced, and the good voice quality is ensured, and the method for reducing residual echo is convenient to be applied to electronic devices such as embedded products. In addition, when the method for reducing residual echo is applied in the field of intelligent speech recognition, it can promote the improvement of speech recognition rate. Moreover, when the method for reducing residual echo is applied to communications such as network conference calls, the call quality can be improved.

It is to be understood that the term "comprises", "comprising", or any other variants thereof, is intended to encompass a non-exclusive inclusion, such that a process, method, article, or device of a series of elements not only comprise those elements but also comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A method for reducing residual echo, comprising the following steps of:
   performing an echo cancellation process on a voice input signal according to an echo reference signal to obtain an echo cancellation signal;
   performing a fast Fourier Transform (FFT) on the echo reference signal to obtain a reference spectrum signal for each frame;
   performing the FFT on the echo cancellation signal to obtain a speech spectrum signal for each frame;
   using the reference spectrum signal of a current frame and the speech spectrum signal of the current frame to obtain a priori signal-to-noise ratio of the current frame according to a principle of additive noise;
   filtering the speech spectrum signal of the current frame by a Wiener filter coefficient of the current frame determined by the priori signal-to-noise ratio of the current frame to obtain a target spectrum signal of each frame; and
   performing an inverse fast Fourier Transform (IFFT) on the target spectrum signal of each frame to obtain a target voice signal;
   wherein the priori signal-to-noise ratio of the current frame is the ratio of the non-reference spectrum signal in the speech spectrum signal of the current frame to the reference spectrum signal of the current frame.

2. The method according to claim 1, further comprising:
   obtaining a voice reception signal received by an audio reception module of an electronic device; and
   performing a first preprocessing procedure on the voice reception signal to obtain the voice input signal.

3. The method according to claim 2, wherein the first preprocessing procedure comprises: performing beamforming and denoising processing on the voice reception signal.

4. The method according to claim 1, further comprising:
   collecting an audio analog signal output by a power amplifier circuit of an electronic device, and performing analog-to-digital conversion on the audio analog signal to obtain the echo reference signal, wherein the audio analog signal is played through a speaker of the electronic device.

5. The method according to claim 1, further comprising:
   performing a second preprocessing procedure on the target voice signal to obtain a voice output signal.

6. The method according to claim 5, wherein the second preprocessing procedure comprises: performing beamforming and denoising processing on the target voice signal.

7. An electronic device, comprising:
   a non-transitory computer-readable storage medium configured to store program code; and
   one or more processors configured to execute the program code to:
      perform an echo cancellation process on a voice input signal according to an echo reference signal to obtain an echo cancellation signal;
      perform a fast Fourier Transform (FFT) on the echo reference signal to obtain a reference spectrum signal for each frame;
      perform the FFT on the echo cancellation signal to obtain a speech spectrum signal for each frame;
      use the reference spectrum signal of a current frame and the speech spectrum signal of the current frame to obtain a priori signal-to-noise ratio of the current frame according to a principle of additive noise;
      filter the speech spectrum signal of the current frame by a Wiener filter coefficient of the current frame determined by the priori signal-to-noise ratio of the current frame to obtain a target spectrum signal of each frame; and
      perform an inverse fast Fourier Transform (IFFT) on the target spectrum signal of each frame to obtain a target voice signal;
      wherein the priori signal-to-noise ratio of the current frame is the ratio of the non-reference spectrum signal in the speech spectrum signal of the current frame to the reference spectrum signal of the current frame.

8. The electronic device according to claim 7, wherein the electronic device further comprises:
   a power amplifier circuit connected to the one or more processors and configured to output an audio analog signal;
   a speaker connected to the power amplifier circuit and configured to play the audio analog signal; and
   a recovery circuit connected to the power amplifier circuit and configured to collect the audio analog signal and perform analog-to-digital conversion on the audio analog signal to obtain the echo reference signal.

9. The electronic device according to claim 8, wherein the electronic device further comprises:
   a memory connected to the recovery circuit and the one or more processors and configured to store the echo reference signal.

10. The electronic device according to claim 7, the electronic device further comprises an audio reception module configured to receive a voice reception signal, and the one or more processors are further configured to perform a first preprocessing procedure on the voice reception signal to obtain the voice input signal.

11. The electronic device according to claim 10, wherein the one or more processors are further configured to perform beamforming and denoising processing on the voice reception signal to obtain the voice input signal.

12. The electronic device according to claim 7, wherein the one or more processors are further configured to perform a second preprocessing procedure on the target voice signal to obtain a voice output signal.

13. The electronic device according to claim 12, wherein the one or more processors are further configured to perform beamforming and denoising processing on the target voice signal to obtain the voice output signal.

* * * * *